(12) United States Patent
Hamada et al.

(10) Patent No.: US 11,171,607 B2
(45) Date of Patent: Nov. 9, 2021

(54) SOURCE INJECTION MIXER

(71) Applicant: Nippon Telegraph and Telephone Corporation, Tokyo (JP)

(72) Inventors: Hiroshi Hamada, Tokyo (JP); Teruo Jo, Tokyo (JP); Hideyuki Nosaka, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 0 days.

(21) Appl. No.: 16/981,991

(22) PCT Filed: Feb. 21, 2019

(86) PCT No.: PCT/JP2019/006468
§ 371 (c)(1),
(2) Date: Sep. 17, 2020

(87) PCT Pub. No.: WO2019/181344
PCT Pub. Date: Sep. 26, 2019

(65) Prior Publication Data
US 2021/0111674 A1    Apr. 15, 2021

(30) Foreign Application Priority Data
Mar. 19, 2018    (JP) .............. JP2018-050701

(51) Int. Cl.
*H03D 7/14*    (2006.01)
*H03D 7/12*    (2006.01)
*H04L 25/02*   (2006.01)

(52) U.S. Cl.
CPC .......... *H03D 7/125* (2013.01); *H03D 7/1466* (2013.01); *H04L 25/0278* (2013.01)

(58) Field of Classification Search
CPC ... H03D 7/125; H03D 7/1466; H04L 25/0278
See application file for complete search history.

(56) References Cited

U.S. PATENT DOCUMENTS

| 4,592,095 A * | 5/1986 | Ohnishi | ............... H03D 9/0675 |
| | | | 455/317 |
| 8,249,541 B2 * | 8/2012 | Bao | ........................ H03D 7/125 |
| | | | 455/330 |

(Continued)

OTHER PUBLICATIONS

Madihian, Mohammad, et al., "A Monolithic AlGaAd/InGaAs Upconverter IC for K-Band Wireless Networks," IEEE Transactions on Microwave Theory and Techniques, Dec. 1995, vol. 43, No. 12, pp. 2773-2777.

*Primary Examiner* — Dinh T Le
(74) *Attorney, Agent, or Firm* — Slater Matsil, LLP

(57) ABSTRACT

A source injection mixer includes an FET, an IF matching circuit between an IF port and a gate of the FET, and that matches impedance of the IF port and impedance of the gate as viewed from the IF port, a shorting stub of which one end is connected to a source of the FET and another end is grounded, and shorter than ¼ of an electric length at a frequency of LO signals, an LO matching circuit between an LO port and the source of the FET, and that matches impedance of the LO port and impedance of the source as viewed from the LO port, and an RF matching circuit between an RF port and a drain of the FET, and that matches impedance of the RF port and impedance of the drain as viewed from the RF port.

12 Claims, 12 Drawing Sheets

(56) References Cited

U.S. PATENT DOCUMENTS

| | | | | |
|---|---|---|---|---|
| 8,548,416 B2* | 10/2013 | Suzuki | ................... | H03D 7/02 |
| | | | | 455/333 |
| 2015/0229283 A1* | 8/2015 | Kuwata | .................. | H03F 3/602 |
| | | | | 330/250 |

* cited by examiner

SOURCE INJECTION MIXER

CROSS-REFERENCE TO RELATED APPLICATIONS

This application is a national phase entry of PCT Application No. PCT/JP2019/006468, filed on Feb. 21, 2019, which claims priority to Japanese Application No. 2018-050701, filed on Mar. 19, 2018, which applications are hereby incorporated herein by reference.

TECHNICAL FIELD

The present invention relates to circuit technology that handles radio frequency electric signals, and in particular to a mixer that has frequency conversion functions.

BACKGROUND

A mixer is an electronic circuit that has frequency conversion functions. Specifically, radio frequency signals (RF (Radio Frequency) signals) or intermediate frequency signals (IF (Intermediate Frequency) signals) are multiplied by local oscillator signals (LO (Local Oscillator) signals) thereby converting the frequency thereof into IF signals or RF signals. Normally, the frequency of RF signals is higher than the frequency of IF signals. A case where frequency conversion is performed from RF signals to IF signals is called downconversion, and a case where frequency conversion is performed from IF signals to RF signals is called upconversion. The mixer is a radio frequency part that is indispensable for wireless communication equipment such as mobile terminals that employ heterodyning, radio frequency measurement instruments such as spectrum analyzers, and so forth.

Various circuit configurations are being proposed for mixers. These are generally classified into those using diodes, and those using transistors such as field-effect transistors (FET) or the like. Configurations using transistors can realize frequency conversion that has gain at the time of frequency conversion, by utilizing amplification effects that diodes cannot realize. A value obtained by normalizing electric power of RF signals or IF signals after frequency conversion that are output from the mixer by electric power of IF signals or RF signals before frequency conversion that are input to the mixer is called conversion gain. Also, mixers that use amplification effects in frequency conversion are called active mixers, and mixers that do not use amplification effects are called passive mixers.

The upper limit value for conversion gain of mixers using normal diodes and passive mixers (resistive mixers, etc., see NPL 1) is $1/\pi^2$ to $-10$ dB for single-ended configurations, which is small. Conversely, active mixers use amplification functions of transistors, whereby mixers can be realized that have conversion gain greater than $-10$ dB. In a case where the electric power level of signals before frequency conversion is small, a higher conversion gain of the mixer is desirable. Accordingly, active mixers are often used in radio frequency systems.

Active mixers are classified into three types, namely gate injection mixers, drain injection mixers, and source injection mixers, depending on which terminal of the transistor that LO signals are input to. In the following description, a case of performing upconversion operations will be described for the sake of simplicity. It is needless to say that each of the three types of mixers is usable for both upconversion and downconversion. Also, a case of using a FET as a transistor will be described for the sake of simplicity. In a case of using a bipolar transistor, gate can be restated as base, drain as collector, and source as emitter, in the following description.

A gate injection mixer is a form where two signals, namely IF signals and LO signals, are input to the gate of a source-grounded FET, and RF signals are taken from the drain. This is the form most commonly used out of the three types of mixers. In a gate injection mixer, frequency conversion is performed using amplification effects of the source-grounded amplifier, and the conversion gain thereof is generally large. However, the two signals of IF signals and LO signals are input to one terminal in a gate injection mixer, so isolation of the IF signals and LO signals cannot be secured. Accordingly, there are cases where LO signals leak from the IF terminal of the mixer, and adversely affect parts that are upstream from the IF terminal of the mixer making up a radio frequency system (e.g., modulating bias of the IF amplifier or the like). In order to secure isolation of the IF signals and LO signals, a combiner or diplexer having isolation functions is needed at the gate input portion of the mixer, separately from the main circuit of the mixer.

A drain injection mixer is a form where IF signals are input to the gate of a source-grounded FET, LO signals are input to the drain, and RF signals are also taken from the drain. A drain injection mixer utilizes gain of a source-grounded FET in the same way as with a gate injection mixer, and high conversion gain is yielded. However, in order to secure isolation of the LO signals and RF signals, a combiner or diplexer having isolation functions is needed to be added at the drain terminal of the mixer. In a case of LO signals leaking to the RF terminal, LO leakage signals are output to the outside of the device from the RF terminal of the wireless system as spurious emissions, and adversely affect other wireless equipment in public.

A source injection mixer is a form where LO signals are input to the source of the FET, IF signals are input to the gate of the FET, and RF signals are output from the drain of the FET. Unlike the gate injection mixer and drain injection mixer, the RF, LO, and IF signals are all input to or output from a different terminal of the FET in a source injection mixer, so isolation characteristics provided among the drain and gate and source of the FET can be utilized. Accordingly, the combiner or diplexer for securing isolation that is necessary in the case of the gate injection mixer and drain injection mixer is unnecessary in a source injection mixer, and there is an advantage that the scale of the circuit can be reduced.

Reported instances of source injection mixers are extremely scarce as compared to gate injection mixers and drain injection mixers. NPL 1 is a reported instance of a source injection mixer where the frequency band of RF signals is around 20 GHz. According to this NPL 1, the current gain cutoff frequency of the FET used is 70 GHz, which is sufficiently higher than the RF frequency, and yet the conversion gain of the source injection mixer is no higher than $-10$ dB, which is somewhat low.

In this way, conventional source injection mixers have had a problem in that the conversion gain is small in comparison with gate injection mixers and drain injection mixers.

CITATION LIST

Non Patent Literature

[NPL 1] Mohammad Madihian, et al., "A Monolithic AlGaAdInGaAs Upconverter IC for K-Band Wireless Networks", IEEE TRANSACTIONS ON MICROWAVE THEORY AND TECHNIQUES, VOL. 43, NO. 12, 1995.

SUMMARY

Embodiments of the present invention have been made to solve the above problem, and it is an object thereof to provide a source injection mixer that can realize a larger conversion gain than realized conventionally.

Means for Solving the Problem

A source injection mixer according to embodiments of the present invention includes a transistor, an IF matching circuit that is inserted between an IF port where IF signals are input and a gate of the transistor, and that matches impedance of the IF port and impedance of the gate as viewed from the IF port, a shorting stub of which one end is connected to a source of the transistor and another end is grounded, and that is shorter than ¼ of an electric length at a frequency of LO signals, an LO matching circuit that is inserted between an LO port where the LO signals are input and the source of the transistor, and that matches impedance of the LO port and impedance of the source as viewed from the LO port; and an RF matching circuit that is inserted between an RF port where RF signals are output and a drain of the transistor, and that matches impedance of the RF port and impedance of the drain as viewed from the RF port.

Also, in a configuration example (second embodiment) of the source injection mixer according to embodiments of the present invention, the LO matching circuit is configured of a first transmission line of which one end is connected to the source of the transistor, a second transmission line of which one end is connected to another end of the first transmission line and another end is connected to the LO port, and a first capacitive element of which one end is connected to a point of connection of the first and second transmission lines, and another end is grounded. The first transmission line is configured of a signal line, and a plurality of second capacitive elements cyclically provided between the signal line and a ground. A cycle at which the second capacitive elements are provided on the signal line is set to a value shorter than ¼ wavelength at a frequency of the LO signals.

Also, in a configuration example (second embodiment) of the source injection mixer according to embodiments of the present invention, the cycle at which the second capacitive elements are provided on the signal line is set to be a value 1/10 or smaller than ¼ wavelength at a frequency of the LO signals.

Also, in a configuration example (second embodiment) of the source injection mixer according to embodiments of the present invention, the IF matching circuit is configured of an open stub of which one end is connected to the gate of the transistor and the other end is open, a third transmission line of which one end is connected to the gate of the transistor, a fourth transmission line of which one end is connected to another end of the third transmission line, a third capacitive element of which one end is connected to a point of connection of the third and fourth transmission lines and another end is grounded, and a fourth capacitive element of which one end is connected to another end of the fourth transmission line and another end is connected to the IF port. The RF matching circuit is configured of a fifth transmission line of which one end is connected to the drain of the transistor, a fifth capacitive element of which one end is connected to another end of the fifth transmission line and another end is grounded, and a sixth capacitive element of which one end is connected to the drain of the transistor and another end is connected to the RF port.

Also, in a configuration example (first embodiment) of the source injection mixer according to embodiments of the present invention, the LO matching circuit is configured of a first transmission line of which one end is connected to the source of the transistor, a first capacitive element of which one end is connected to another end of the first transmission line, and a second transmission line of which one end is connected to another end of the first capacitive element and another end is connected to the LO port. The IF matching circuit is configured of an open stub of which one end is connected to the gate of the transistor and the other end is open, a third transmission line of which one end is connected to the gate of the transistor, a fourth transmission line of which one end is connected to another end of the third transmission line, a second capacitive element of which one end is connected to a point of connection of the third and fourth transmission lines and another end is grounded, and a third capacitive element of which one end is connected to another end of the fourth transmission line and another end is connected to the IF port. The RF matching circuit is configured of a fifth transmission line of which one end is connected to the drain of the transistor, a fourth capacitive element of which one end is connected to another end of the fifth transmission line and another end is grounded, and a fifth capacitive element of which one end is connected to the drain of the transistor and another end is connected to the RF port.

Also, a configuration example (first and second embodiments) of the source injection mixer according to embodiments of the present invention further include a gate bias circuit that applies gate bias voltage to the gate of the transistor, and a drain bias circuit that applies drain bias voltage to the drain of the transistor.

Effects of Embodiments of the Invention

According to embodiments of the present invention, by adding the shorting stub that is shorter than ¼ of the electrical length at the frequency of LO signals to the source of the transistor, and providing the LO matching circuit that matches the impedance of the LO port and the impedance of the source as viewed from the LO port, drop in conversion gain of the mixer due to inductance that the shorting stub has can be avoided, and great conversion gain can be obtained even in a case where the frequency of IF signals (LO signals) is high.

Also, in embodiments of the present invention, the LO matching circuit is configured of the first transmission line, the second transmission line, and the first capacitive element, and the first transmission line is configured of the signal line and a plurality of second capacitive elements cyclically provided between the signal line and a ground. The cycle at which the second capacitive elements are provided on the signal line is set to be a value shorter than ¼ wavelength at the frequency of the LO signals, whereby the first transmission line with impedance sufficiently lower than a normal transmission line can be realized, and the operating band of the LO matching circuit can be expanded. As a result, LO signal frequency dependency of conversion gain of the mixer can be further improved in embodiments of the present invention.

DETAILED DESCRIPTION OF ILLUSTRATIVE EMBODIMENTS

Here, description will be made regarding the cause of conversion gain of source injection mixers being small described above, and the principle of embodiments of the present invention where this cause is removed, thereby improving conversion gain of source injection mixers.

Figure 1:
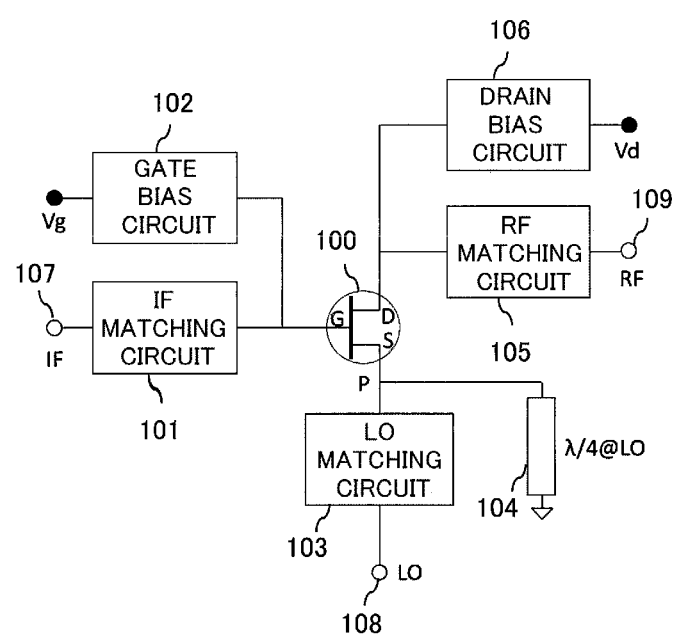
FIG. 1 is a block diagram illustrating a configuration of a conventional source injection mixer.

First, the operation principle of a conventional source injection mixer will be described in brief. FIG. 1 illustrates the overview of a conventional source injection mixer. The source injection mixer is configured of a FET (field-effect transistor) 100, and the following circuits and a shorting stub.

An IF matching circuit 101 of which the input terminal is connected to an IF port 107, and the output terminal is connected to the gate (G) of the FET 100.

A gate bias circuit 102 that applies gate bias voltage to the gate of the FET 100.

An LO matching circuit 103 of which the input terminal is connected to an LO port 108, and the output terminal is connected to the source (S) of the FET 100.

A shorting stub 104 of which one end is connected to the source of the FET 100, and the other end is grounded.

An RF matching circuit 105 of which the input terminal is connected to the drain (D) of the FET 100, and the output terminal is connected to an RF port 109.

A drain bias circuit 106 that applies drain bias voltage to the drain of the FET 100.

In the source injection mixer, the drain bias circuit 106 biases the drain of the FET 100 to the saturation region of the FET 100, and the gate bias circuit 102 biases the gate of the FET 100 to near the threshold value of the FET 100. The shorting stub 104 that is ¼-wavelength at the frequency of LO signals is attached to the source of the FET 100. The source of the FET 100 is grounded by the shorting stub 104 regarding direct current, but is opened at the frequency of LO signals, and voltage can be freely applied.

Also, the gate of the FET 100 is designed such that impedance at the frequency of LO signals is low due to the IF matching circuit 101. Accordingly, at the frequency of LO signals, the FET 100 acts as a gate-grounded FET as viewed from the LO port 108. Input impedance of a gate-grounded FET is a pure resistance value (a value equal to the inverse of transconductance gm of the FET 100). Applying LO signals to the source of the FET 100 via the LO matching circuit 103 in this state modulates the source potential of the FET 100 by the LO signals, and the drain-source voltage Vds and drain-gate voltage Vgs are modulated together.

Figure 2:
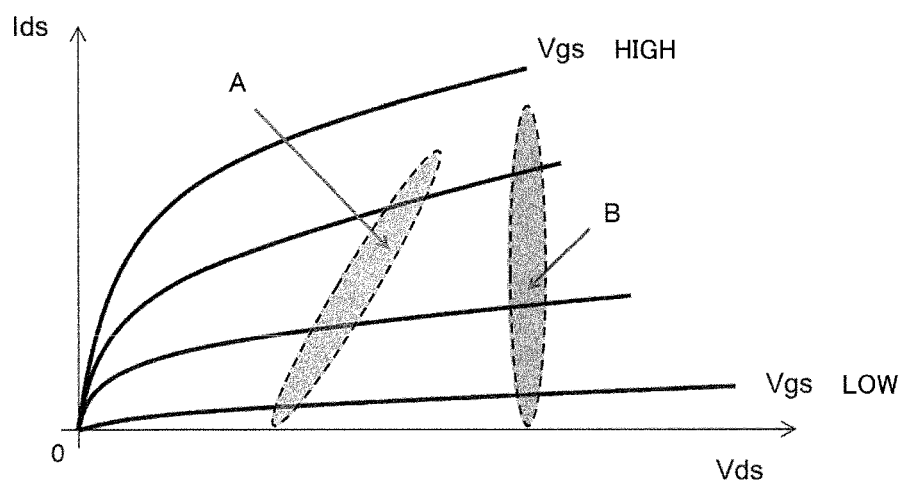
FIG. 2 is a diagram illustrating load lines of a conventional source injection mixer and a source injection mixer according to embodiments of the present invention.

When the source potential Vs of the FET 100 increases due to LO signals, the drain-source voltage Vds and drain-gate voltage Vgs decrease together, and when the source potential Vs of the FET 100 decreases due to LO signals, the drain-source voltage Vds and drain-gate voltage Vgs increase together. Accordingly, a load line (operating region) of a conventional source injection mixer drawn on the drain-source current Ids-drain-source voltage Vds curves of the FET 100 is shown as the region A in FIG. 2.

The drain-source current Ids of the FET 100 on this load line A changes in accordance with application of LO signals, and accordingly the transconductance gm of the FET wo changes in accordance with the LO signals. The operations of the mixer regarding IF signals applied to the gate at this time will be considered. The frequency of IF signals is normally lower than the frequency of LO signals, and accordingly the shorting stub 104 applied to the source of the FET 100 is substantially short-circuited with regard to the frequency of IF signals.

Accordingly, the FET 100 acts as a source-grounded FET at the frequency of IF signals. The transconductance gm of the FET 100 changes in accordance with the LO signals, as described above, and accordingly the transconductance gm of the source-grounded FET constantly changes due to the frequency of LO signals as viewed from the IF port 107, and the magnitude of IF signals output amplified to the drain is modulated by the LO signals. Thus, the multiplication results of IF signals and LO signals are output to the drain of the FET 100 as RF signals. This is the operating principle of conventional source injection mixers.

However, conventional source injection mixers have a problem in that conversion gain markedly drops as the frequency of IF signals rises. This deterioration in conversion gain is due to inductance that the shorting stub 104 added to the source of the FET 100 has. It is generally known that adding inductance to the source of a source-grounded FET reduces gain of the FET.

Figure 3:
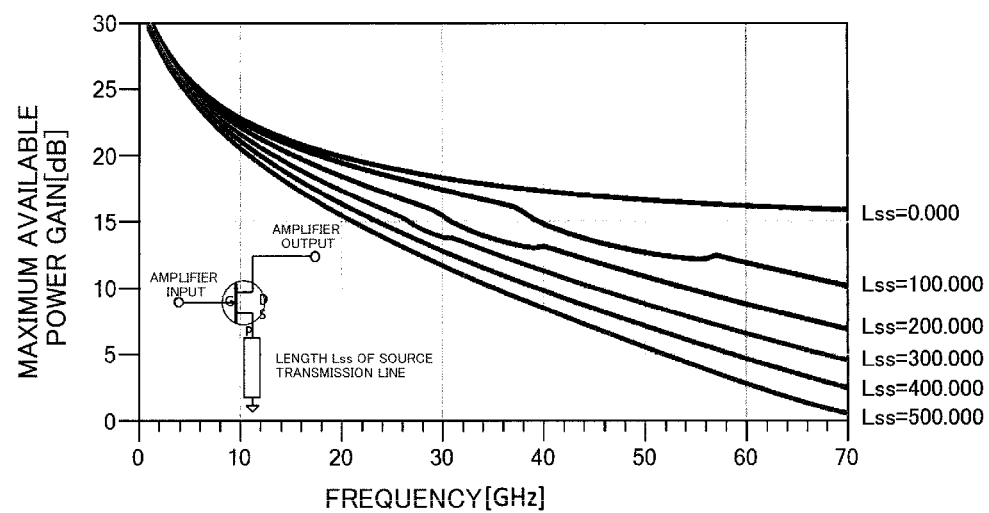
FIG. 3 is a diagram illustrating effects of source inductance of a source-grounded FET on small-signal gain.

FIG. 3 is a diagram where a shorting stub has been added to the source of a source-grounded FET, and the maximum available power gain of the source-grounded FET is plotted with varying lengths of the shorting stub. Here, an InP-HEMT (High Electron Mobility Transistor) with a gate width of 20 μm is assumed as the FET, the characteristic impedance of the shorting stub is 50Ω, and the length is Lss. It can be understood that increasing the length Lss of the shorting stub markedly reduces the maximum available power gain of the source-grounded FET.

A source injection mixer is a mixer that utilizes change in the transconductance gm of the source-grounded FET, i.e., change in gain, as described above. Accordingly, deterioration in gain of the source-grounded FET causes deterioration in conversion gain of the source injection mixer. It can be seen from FIG. 3 that there is hardly any deterioration of conversion gain in a case where the IF signals are low-frequency. The reason is that the inductance of the shorting stub at the source of the FET is negligibly low in a case where IF signals are low-frequency waves near DC (Direct Current).

However, in high-speed wireless systems that use RF frequencies of 100 GHz or higher, for example, IF signals frequencies are inevitably higher since the band used for wireless communication is often wide in order to expand the data rate. Accordingly, the deterioration in conversion gain of source injection mixers arising from the inductance of the shorting stub at the source of the FET is a great problem.

In conventional source injection mixers, there has been a problem in that a shorting stub that is ¼-wavelength at the frequency of LO signals is necessary to apply LO voltage amplitude to the source of the FET, and that gain deteriorates due to the effects of inductance that this shorting stub has, as described above.

In embodiments of the present invention, the mixer is operated by applying current amplitude to the source of the FET instead of applying voltage amplitude, which will be described next, in order to solve this problem. Accordingly, making the length of the shorting stub to be sufficiently shorter than ¼-wavelength and making the source inductance of the FET to be smaller than conventional arrangements is proposed, and means for improving conversion gain is provided.

Figure 4:
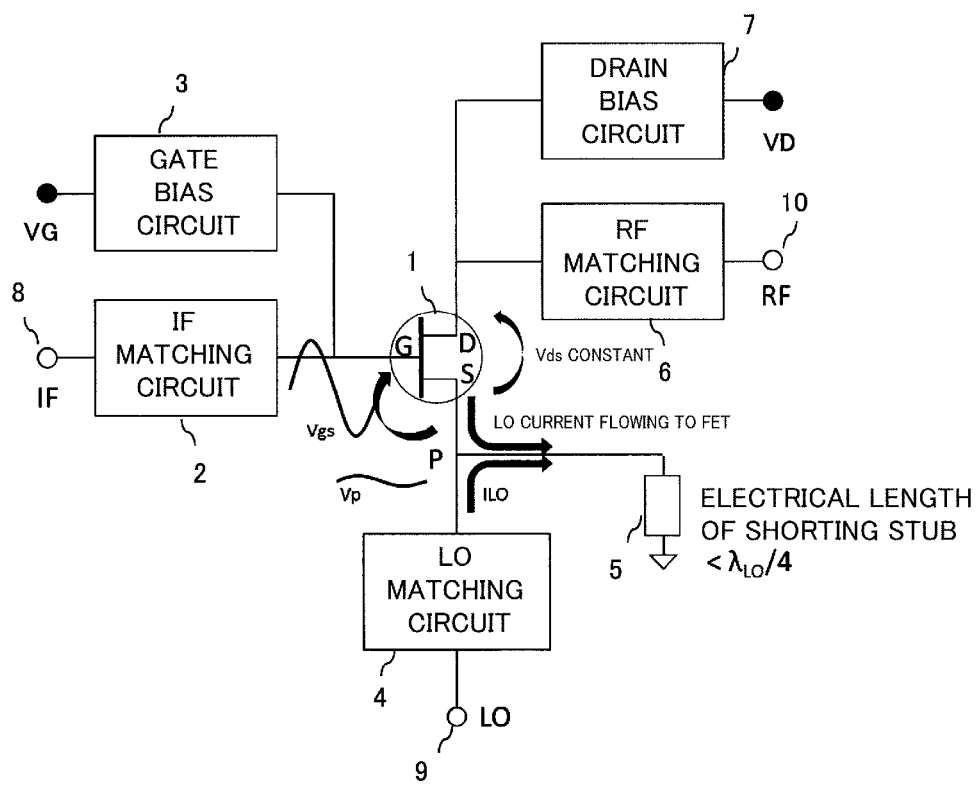
FIG. 4 is a block diagram illustrating a configuration of a source injection mixer according to embodiments of the present invention.

FIG. 4 illustrates a conceptual diagram of a source injection mixer according to embodiments of the present invention. The source injection mixer according to embodiments of the present invention is configured of the following circuits.

An FET 1, and an IF matching circuit 2 that is inserted between an IF port 8 where IF signals are input and the gate (G) of the FET 1, and that matches the impedance of the IF port 8 and the impedance of the gate of the FET 1 as viewed from the IF port 8.

A gate bias circuit 3 that applies gate bias voltage VG to the gate of the FET 1.

An LO matching circuit 4 that is inserted between an LO port 9 where LO signals are input and the source (S) of the FET 1, and that matches the impedance of the LO port 9 and the impedance of the source of the FET 1 as viewed from the LO port 9.

A shorting stub 5 that is a transmission line of which one end is connected to the source of the FET 1 and the other end is grounded.

An RF matching circuit 6 that is inserted between an RF port 10 where RF signals are output and the drain (D) of the FET 1, and that matches the impedance of the RF port 10 and the impedance of the drain of the FET 1 as viewed from the RF port 10.

A drain bias circuit 7 that applies drain bias voltage VD to the drain of the FET 1.

A feature of the source injection mixer according to embodiments of the present invention is that the length of the shorting stub 5 added to the source of the FET 1 is sufficiently shorter than ¼ of the electrical length at the frequency of LO signals, and that the LO matching circuit 4 has further been designed so that impedance of the LO port 9 (normally 50Ω) is converted to a far lower impedance, in order to match the impedance of the source that has become lower due to the shorting stub 5 being shortened. The operation principle of embodiments of the present invention will be described below.

When the length of the shorting stub 5 added to the source of the FET 1 is sufficiently shorter than ¼-wavelength of the frequency of LO signals, e.g., shortened to around ⅒, inductivity of the impedance of the shorting stub 5 becomes extremely low. By designing the LO matching circuit 4 to match this impedance with low inductivity, the LO signals reach the intersection between the source of the FET 1 and the shorting stub 5 (point P in FIG. 4) without losing the power thereof. The impedance at the point P is low, and accordingly inputting LO signals with sufficient power for mixer driving causes a large current to flow to the point P from the LO port 9.

In the configuration of conventional source injection mixers, the length of the shorting stub 104 was ¼-wavelength, so the impedance at the point P as viewed from the LO port 108 was equal to the inverse of transconductance gm of the FET 100 (normally set to 50Ω), and voltage corresponding to LO signals was excited at the point P.

In embodiments of the present invention, the impedance at the point P is set to be low as described above, so the amplitude of voltage Vp at the point P is small, and a large current flows into the point P instead. In the configuration of the present invention, the summation of currents flowing into the point P must be 0, from Kirchhoff's laws. Accordingly, the current flowing to the point P from the FET 1 side must be the same magnitude as the current ILO flowing to the point P from the LO port 9 side.

Accordingly, in embodiments of the present invention, the drain-source current of the FET 1 is greatly modulated without generating voltage at the source of the FET 1. This current change is borne by the leakage amount of LO signals to the gate in the present invention. The LO signals leaking to the gate impart a great change in the drain-source current that is necessary for the aforementioned Kirchhoff's laws to be satisfied. The FET 1 has the transconductance gm, and accordingly can cause a great change in drain current by a small change in gate voltage, by leakage of LO signals.

Thus, in embodiments of the present invention, the drain-source voltage Vds is not modulated, and the drain-source current Ids changes by modulation of the gate voltage alone. Accordingly, a load line (operating region) of the source injection mixer according to embodiments of the present invention drawn on the drain-source current Ids-drain-source voltage Vds curves of the FET 1 is shown as the region B in FIG. 2. The large change in transconductance gm can be obtained at the region B in FIG. 2, in the same way as the region A, so mixer operations can be performed.

Further, the length of the shorting stub 5 added to the source of the FET 1 is shorter than conventional arrangements in embodiments of the present invention, so the inductance thereof is small, and as a result lower conversion gain of the mixer due to the effects of the source inductance as shown in FIG. 3 and described above can be avoided, and consequently great conversion gain can be obtained even if the frequency of the IF signals is high.

First Embodiment

Figure 5:
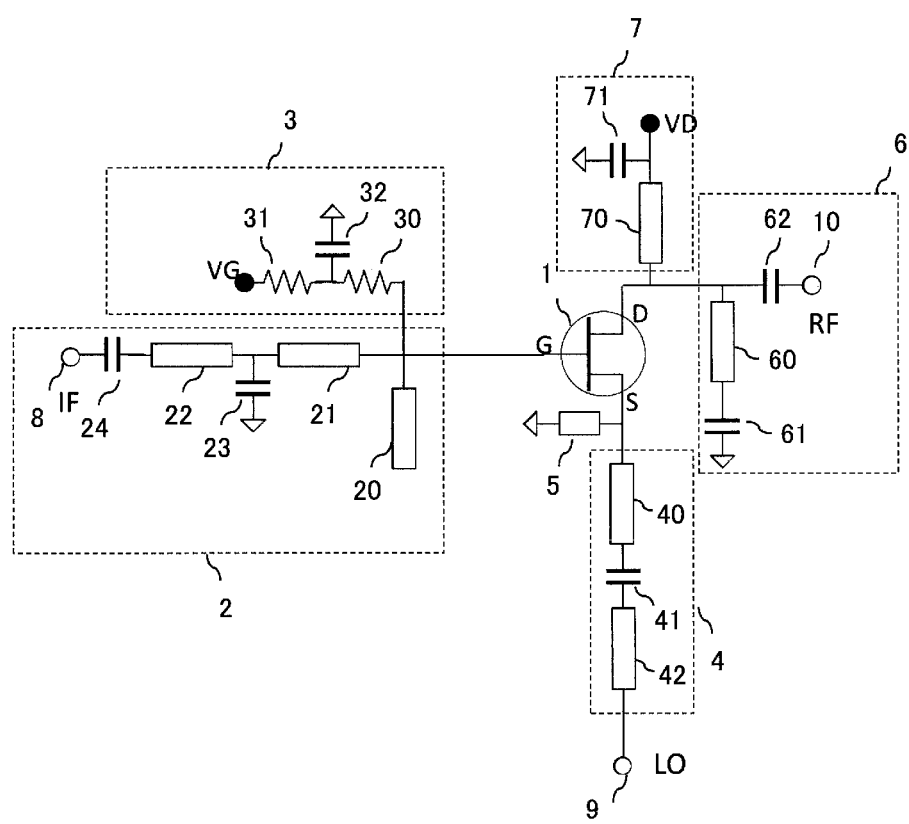
FIG. 5 is a circuit diagram illustrating a configuration of a source injection mixer according to a first embodiment of embodiments of the present invention.

An embodiment of the present invention will be described below with reference to the Figures. FIG. 5 is a circuit diagram illustrating the configuration of a source injection mixer according to a first embodiment of the present invention. Configurations that are the same as those in FIG. 4 are denoted by the same symbols. FIG. 5 illustrates a specific example of FIG. 4. A case where the length of the shorting stub 5 is an electrical length of 0.0275 at the frequency of LO signals will be described as the first embodiment of the present invention. The frequency of LO signals was set to 240 GHz, the frequency of IF signals to 40 to 70 GHz, and the frequency of RF signals to 280 to 310 GHz. Further, an InP-HEMT with a gate width of 40 μm was used for the FET 1.

The shorting stub 5 that is a transmission line having characteristic impedance of 60Ω, and electrical length of 0.0275 at the frequency of the LO signals is connected between the source and ground of the FET 1.

The LO matching circuit 4 is configured of a transmission line 40 of which one end is connected to the source of the FET 1, a capacitive element 41 of which one end is connected to the other end of the transmission line 40, and a transmission line 42 of which one end is connected to the other end of the capacitive element 41 and the other end is connected to the LO port 9.

The element values of the transmission lines and capacitive element used in the LO matching circuit 4 are as follows. First, the transmission line 40 that has characteristic impedance of 40Ω and electrical length of 0.25 is connected to the source of the FET 1. The capacitive element 41 that has a capacitance value of 9 fF is connected to the other end of this transmission line 40. Further, the transmission line 42 that has characteristic impedance of 40Ω, and electrical length of 0.2 is connected between the other end of the capacitive element 41 and the LO port 9.

The gate bias circuit 3 is configured of a resistor 30 of 500Ω of which one end is connected to the gate of the FET 1, a resistor 31 of 1000Ω of which one end is connected to the other end of the resistor 30 and gate bias voltage VG is applied to the other end, and a capacitive element 32 that has a capacitance value of 1 pF of which one end is connected to the point of connection of the resistors 30 and 31, and the other end is grounded.

The IF matching circuit 2 is configured of an open stub 20 that is a transmission line of which one end is connected to the gate of the FET 1 and the other end is open, a transmission line 21 of which one end is connected to the gate of the FET 1, a transmission line 22 of which one end is connected to the other end of the transmission line 21, a capacitive element 23 of which one end is connected to the point of connection of the transmission lines 21 and 22 and the other end is grounded, and a capacitive element 24 of which one end is connected to the other end of the transmission line 22 and the other end is connected to the IF port 8.

The element values of the transmission lines and capacitive element used in the IF matching circuit 2 are as follows. First, the open stub 20 that has characteristic impedance of 50Ω, and an electrical length of 0.2 at the frequency of the LO signals is connected to the gate of the FET 1. Also connected to the gate of the FET 1 is the transmission line 21 that has characteristic impedance of 57Ω and an electrical length of 1.25 at the frequency of the LO signals. The transmission line 22 that has characteristic impedance of 41Ω and an electrical length of 0.23 at the frequency of the LO signals is connected to the other end of the transmission line 21. The capacitive element 23 that has a capacitance value of 35 fF is connected between the point of connection of the transmission lines 21 and 22, and the ground. The capacitive element 24 that has a capacitance value of 200 fF is connected between the transmission line 22 and the other end and the IF port 8.

The drain bias circuit 7 is configured of a transmission line 70 of which one end is connected to the drain of the FET 1 and drain bias voltage VD is applied to the other end, and a capacitive element 71 of which one end is connected to the other end of the transmission line 70 and the other end is grounded. The transmission line 70 has characteristic impedance of 50Ω and an electrical length of 0.25 at the frequency of the LO signals. The capacitance value of the capacitive element 71 is 300 fF.

The RF matching circuit 6 is configured of a transmission line 60 of which one end is connected to the drain of the FET 1, a capacitive element 61 of which one end is connected to the other end of the transmission line 60 and the other end is grounded, and a capacitive element 62 of which one end is connected to the drain of the FET 1 and the other end is connected to the RF port 10. The transmission line 60 has characteristic impedance of 40Ω and an electrical length of 0.26 at the frequency of the LO signals. The capacitance value of the capacitive element 61 is 33 fF, and the capacitance value of the capacitive element 62 is 10 fF.

The drain voltage of the FET 1 is biased by the drain bias circuit 7 to 1.2 V, which is the saturation region of the FET 1. The gate voltage of the FET 1 is biased by the gate bias circuit 3 to −0.45 V, which is the threshold voltage of the FET 1.

Figure 6:
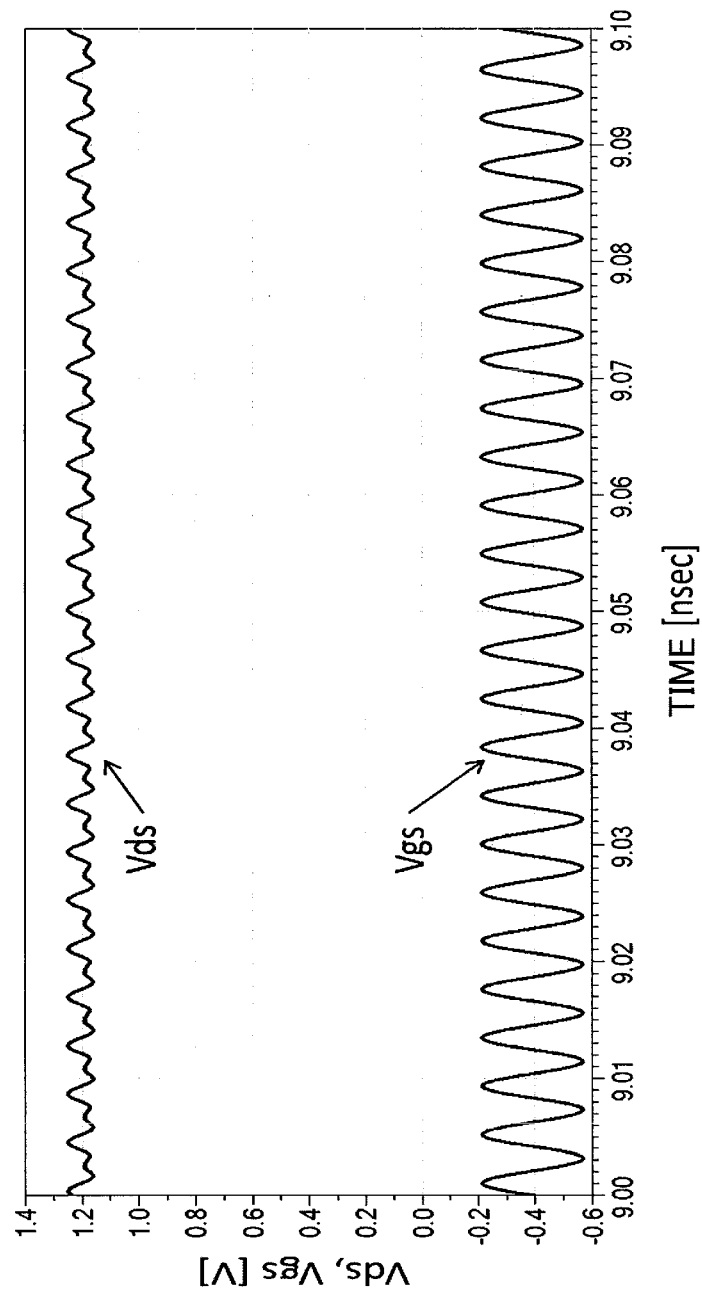
FIG. 6 is a diagram illustrating temporal waveforms of drain-source voltage and gate-source voltage of the source injection mixer according to the first embodiment of the present invention.

FIG. 6 illustrates simulation results of temporal waveforms of the drain-source voltage Vds and gate-source voltage Vgs of the FET 1 when inputting signals having a frequency of 241 GHz and a power value of 5 dBm as LO signals, and inputting signals having a frequency of 60 GHz and a power value of −30 dBm as IF signals, to the source injection mixer of the configuration illustrated in FIG. 5. It can be understood that the drain-source voltage Vds of the FET 1 is hardly modulated at all by the LO signals, but the gate-source voltage Vgs is modulated around ±0.2 V by leakage signals of the LO signals, as described earlier in the principle of embodiments of the invention.

Figure 7:
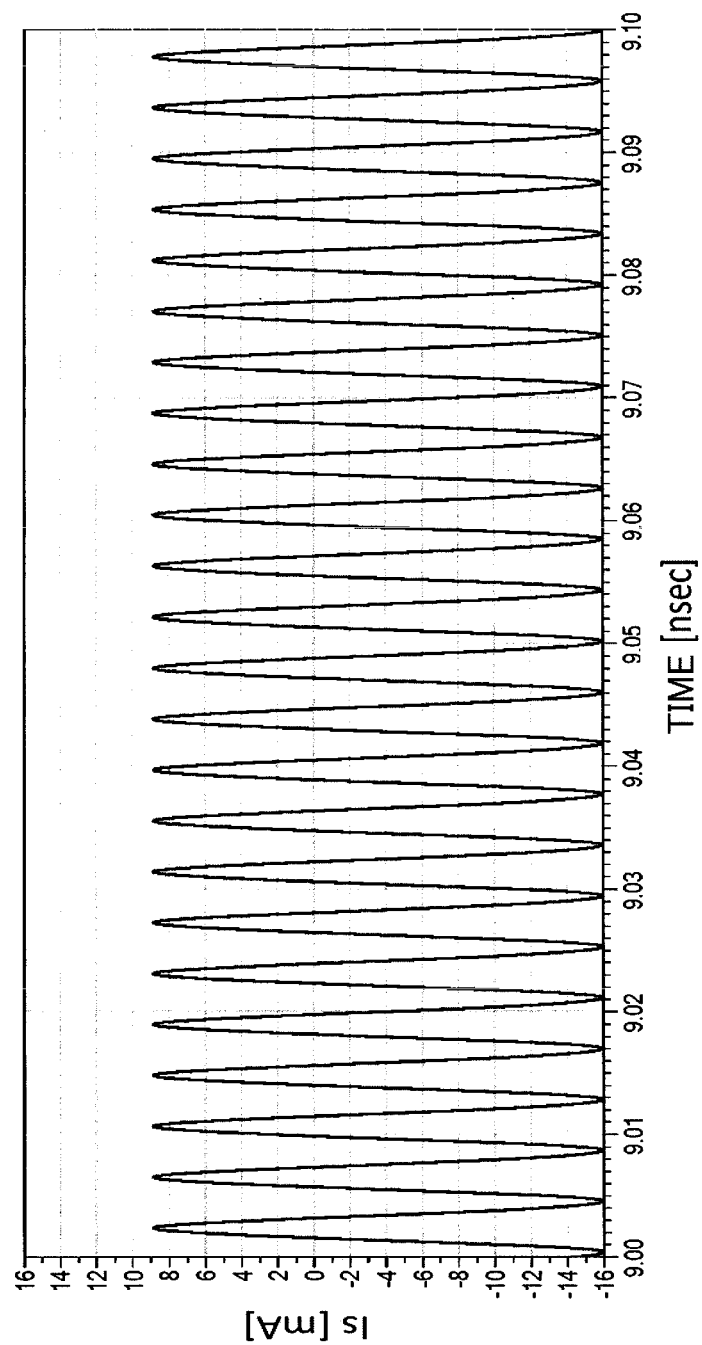
FIG. 7 is a diagram illustrating a temporal waveform of source current of the source injection mixer according to the first embodiment of the present invention.

Also, FIG. 7 illustrates the temporal waveform of source current Is flowing out from the source of the FET 1. It can be understood from FIG. 7 that current amplitude of ±12 mA is being obtained. The drain-source current Ids flowing with drain-source voltage Vds=1.2 V is approximately 30 mA in direct current operations of the FET 1, so it can be understood that an amplitude of ±12 mA for the source current Is is an extremely great current amount.

Figure 8:
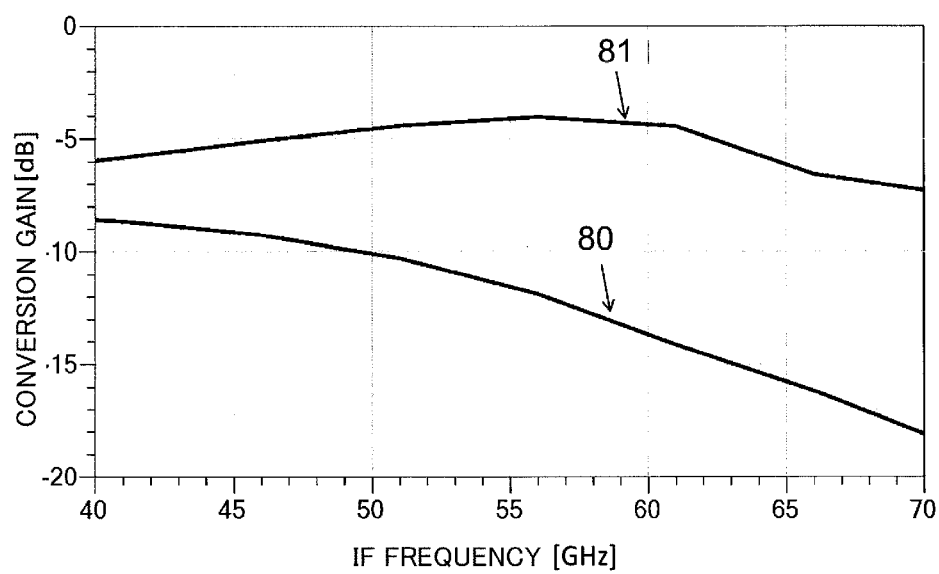
FIG. 8 is a diagram illustrating conversion gain of a conventional source injection mixer and the source injection mixer according to the first embodiment of the present invention.

FIG. 8 illustrates dependency of conversion gain on IF signal frequency of the conventional source injection mixer illustrated in FIG. 1 and the source injection mixer according to the present embodiment. 80 in FIG. 8 denotes the conversion gain of the conventional source injection mixer, and 81 denotes conversion gain of the source injection mixer according to the present embodiment. Here, the frequency of LO signals was set to 241 GHz, the frequency of IF signals to 40 to 70 GHz, the power of LO signals to 5 dBm, and the power of IF signals to −20 dBm. For the configuration of the conventional source injection mixer, an arrangement was used where the length of the shorting stub 104 added to the source of the FET 100 was ¼ of the electrical length at the frequency of the LO signals, and the LO matching circuit 103 was matched with the impedance of the source of the FET 100.

It can be understood from FIG. 8 that the conventional source injection mixer has lower conversion gain than the source injection mixer according to the present embodiment, and further, the conversion gain greatly falls along with increase in the frequency of the IF signals. The reason why the situation in FIG. 8 occurs regarding characteristics of the conventional source injection mixer is because, as described above in the principle of embodiments of the invention, in a case where the frequency of the IF signals is high, the gain of the source-grounded FET drops due to effects of inductance of the shorting stub 104, and the conversion gain drops, being affected thereby.

In the present embodiment, the length of the shorting stub 5 is markedly shorter than conventional arrangements, and the operations of the FET 1 are changed to current operations instead of voltage operations, whereby the conversion gain can be markedly improved as compared to conventional arrangements.

Second Embodiment

Figure 9:
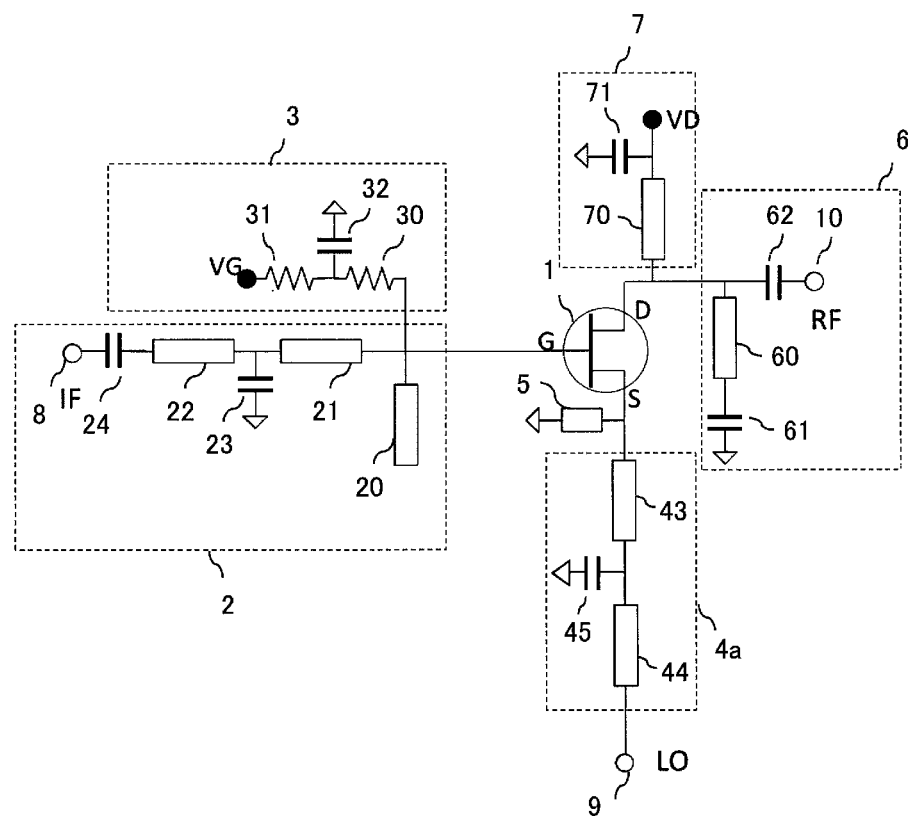
FIG. 9 is a circuit diagram illustrating a configuration of a source injection mixer according to a second embodiment of the present invention.

Next, a second embodiment of the present invention will be described. FIG. 9 is a circuit diagram illustrating the configuration of a source injection mixer according to a second embodiment of the present invention. Configurations that are the same as those in FIG. 5 are denoted by the same symbols. The source injection mixer according to the present embodiment is configured of the FET 1, the IF matching circuit 2, the gate bias circuit 3, an LO matching circuit 4a, the shorting stub 5, the RF matching circuit 6, and a drain bias circuit 7.

There is a need in embodiments of the present invention to perform matching between the impedance of the source that has markedly dropped due to the effect of the shorting stub 5 that is sufficiently shorter than ¼-wavelength and that is connected to the source of the FET 1, and the impedance of the LO port 9 (normally 50Ω), as described above. Matching between such low impedance and 50Ω would narrow the operating band of a matching circuit using normal transmission lines.

Accordingly, in the present embodiment, the operating band is expanded by a multi-stage matching circuit using a pseudo-low-impedance transmission line that has impedance sufficiently lower than a normal transmission line.

The IF matching circuit 2, gate bias circuit 3, shorting stub 5, RF matching circuit 6, and drain bias circuit 7 are as described in the first embodiment.

The LO matching circuit 4a according to the present embodiment is configured of a transmission line 43 of which one end is connected to the source of the FET 1, a transmission line 44 of which one end is connected to the other end of the transmission line 43 and the other end is connected to the LO port 9, and a capacitive element 45 of which one end is connected to the point of connection of the transmission lines 43 and 44 and the other end is grounded. The transmission line 43 has characteristic impedance of 10Ω and an electrical length of 0.08 at 241 GHz. The transmission line 44 has characteristic impedance of 30Ω and an electrical length of 0.125 at 241 GHz. The capacitance value of the capacitive element 45 is 21 fF.

The transmission line 43 of 10Ω used in the present embodiment is difficult to realize with a normal semiconductor process. Accordingly, a transmission line that equivalently has characteristic impedance of 10Ω was realized by the following pseudo-low-impedance transmission line.

Figure 10:
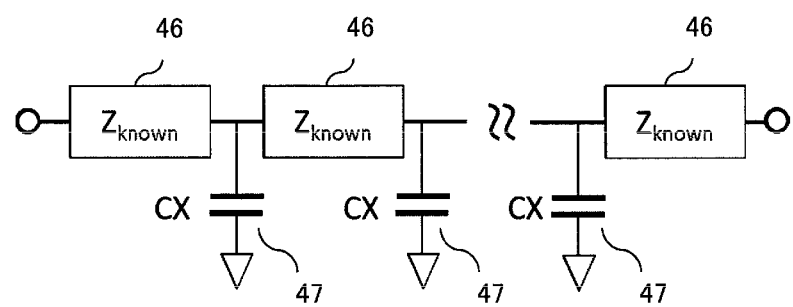
FIG. 10 is a block diagram illustrating a configuration of a pseudo-low-impedance transmission line according to the second embodiment of the present invention.

The pseudo-low-impedance transmission line is an arrangement that artificially realizes a low-impedance line using a MIM (Metal-Insulator-Metal) capacitive element normally used in integrated circuit processes. The pseudo-low-impedance transmission line can be formed by cyclically loading MIM capacitive elements 47 between transmission lines 46 and the ground as illustrated in FIG. 10, as to a normal transmission line 46 (signal line) serially inserted in a signal propagation path.

This pseudo-low-impedance transmission line can be explained as follows. Characteristic impedance Z of the transmission line 46 can be described as in Formula (1), where capacitance per unit length of the transmission line 46 (capacitance inserted in parallel between the signal line and ground) is written as C, and inductance per unit length of the transmission line 46 (capacitance serially inserted in the signal line) as L.

[Formula 1]

$$Z = \sqrt{\frac{L}{C}} \quad (1)$$

That is to say, the value of C that is the denominator in Formula (1) can be increased by loading MIM capacitive elements 47 between the transmission line 46 and ground, and accordingly the characteristic impedance of the transmission line 46 can be reduced.

The method of deriving a load capacitance value for creating the desired characteristic impedance for the transmission line 46 by calculation will be described. First, the known characteristic impedance Z known of the transmission line 46 before being imparted with the MIM capacitive elements 47 can be described as in Formula (2) in the same way as Formula (1), where capacitance per unit length of the transmission line 46 is written as C, and inductance as L.

[Formula 2]

$$Z_{known} = \sqrt{\frac{L}{C}} \quad (2)$$

In the same way, with the loading capacitance per unit length necessary for forming a low-impedance transmission line with characteristic impedance ZX as CX, the characteristic impedance ZX can be described as follows.

[Formula 3]

$$Z_X = \sqrt{\frac{L}{C + C_X}} \quad (3)$$

Solving Formula (2) and Formula (3) regarding CX yields the following Formula.

[Formula 4]

$$C_X = \left\{\left(\frac{Z_{known}}{Z_X}\right)^2 - 1\right\} C \quad (4)$$

CX shown in this Formula (4) is the loading capacitance per unit length necessary for forming a low-impedance transmission line with characteristic impedance ZX, according to the preset embodiment. C in Formula (4) is a known capacitance value per unit length of the transmission line 46, as described above. This capacitance value C is a value decided by the shape of the transmission line 46, and can be separately found by calculation.

Figure 11:
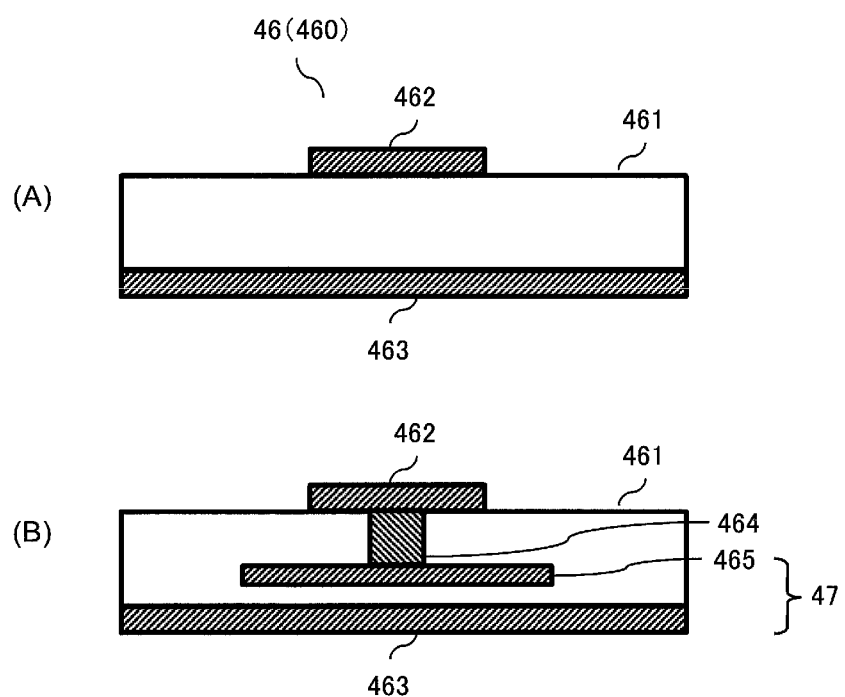
FIG. 11 is a cross-sectional view illustrating structures of a thin-film microstrip line and a MIM capacitive element.

A thin-film microstrip line, for example, can be used as the transmission line 46. FIG. 11(A) illustrates the structure of a thin-film microstrip line. The transmission line 46 (thin-film microstrip line 460) is configured of a thin-film dielectric member 461, a signal line 462 formed of metal formed on the surface of this dielectric member 461, and a metal layer 463 that is a ground formed on the rear face of the dielectric member 461. FIG. 11(B) illustrates the structure of the MIM capacitive elements 47 that are cyclically loaded to the transmission line 46 (thin-film microstrip line 460). The MIM capacitive element 47 uses the metal layer 463 that is the ground as one electrode. That is to say, the MIM capacitive element 47 is configured of a metal layer 465 serving as an electrode that is electrically connected to the signal line 462 via a through hole 464, the metal layer 463 that is an electrode opposing this metal layer 465, and the dielectric member 461 between the metal layer 463 and metal layer 465.

In the present embodiment, the characteristic impedance of the transmission line 46 is equivalently reduced by the pseudo line obtained by cyclically disposing MIM capacitive elements 47 on the transmission line 46. At this time, if the length of a transmission line 46 between a MIM capacitive element 47 and an adjacent MIM capacitive element 47 exceeds ¼-wavelength, the transmission line 46 will begin to act as an impedance conversion element like a transformer, and the above-described discussion no longer holds.

In order to form a low-impedance transmission line, the length of a transmission line 46 between a MIM capacitive element 47 and an MIM capacitive element 47 adjacent thereto needs to be sufficiently smaller than ¼-wavelength. Specifically, setting the loading cycle of MIM capacitive elements 47 such that the transmission line 46 between the MIM capacitive element 47 and the MIM capacitive element 47 adjacent thereto is around ¹⁄₁₀ or lower than the ¼-wavelength at the desired design frequency (frequency of LO signals) enables the pseudo-low-impedance transmission line according to the present embodiment to be realized, without having impedance conversion behavior like a transformer, such as described above.

In the present embodiment, the metal thickness of the signal line 462 of the transmission line 46 (thin-film microstrip line 460) was set to 2 μm, and the thickness of the metal layer 463 that is the ground to 1 μm. The permittivity of the thin-film dielectric member 461 between the signal line 462 and metal layer 463 that is the ground was set to 2.7, assuming that the thin-film dielectric member 461 would be BCB (benzocyclobutene). Further, the width of the signal line 462 was set to 12 μm, and 0.8 fF/μm MIM capacitive elements 47 were loaded between the signal line 462 and the metal layer 463 that is the ground every 15 μm in length of the signal line 462. Thus, the transmission line 43 with characteristic impedance of 10Ω can be realized by the pseudo-low-impedance transmission line illustrated in FIG. 10.

In the present embodiment, LO matching can be performed over a wide band by the above effects of the pseudo-low-impedance transmission line, and as a result, LO signal frequency dependency of conversion gain of source injection mixers can be improved.

Figure 12:
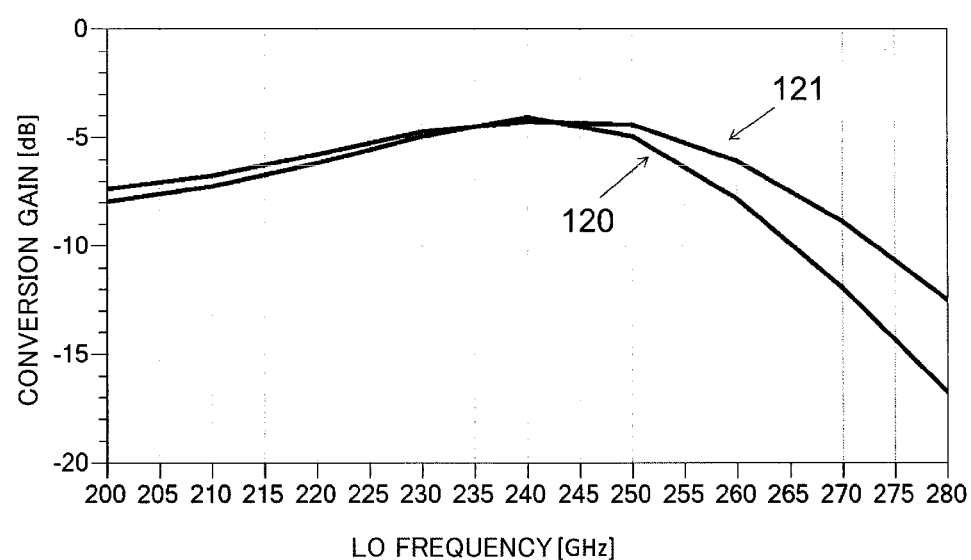
FIG. 12 is a diagram illustrating conversion gain of the source injection mixer according to the first embodiment of the present invention and the source injection mixer according to the second embodiment of the present invention.

FIG. 12 illustrates conversion gain of source injection mixers according to the first embodiment and the present embodiment. 120 in FIG. 12 denotes conversion gain of the source injection mixer according to the first embodiment, and 121 denotes conversion gain of the source injection mixer according to the present embodiment. It can be understood that the mixer according to the present embodiment can realize conversion gain with little dependency on change in LO signal frequency in comparison with the first embodiment, due to the low-impedance LO matching circuit 4a.

INDUSTRIAL APPLICABILITY

Embodiments of the present invention can be applied to radio-frequency circuit technology.

REFERENCE SIGNS LIST

1 FET
2 IF matching circuit
3 Gate bias circuit
4, 4a LO matching circuit
5 Shorting stub
6 RF matching circuit
7 Drain bias circuit
8 IF port
9 LO port
10 RF port
20 Open stub
21, 22, 40, 42 to 44, 60, 70 Transmission line
23, 24, 32, 41, 45, 61, 62, 71 Capacitive element
30, 31 Resistor
47 MIM capacitive element

The invention claimed is:
1. A source injection mixer, comprising:
a transistor;
an intermediate frequency (IF) matching circuit between an IF port and a gate of the transistor, wherein an IF signal is input in the IF port, and wherein the IF matching circuit matches an impedance of the IF port and an impedance of the gate as viewed from the IF port;
a shorting stub, wherein a first end of the shorting stub is directly connected to a source of the transistor, wherein a second end of the shorting stub is grounded, and wherein the shorting stub is shorter than a quarter of an electrical length at a frequency of a local oscillator (LO) signal;
an LO matching circuit between an LO port and the source of the transistor, wherein the LO signal is input in the LO port, and wherein the LO matching circuit matches an impedance of the LO port and an impedance of the source as viewed from the LO port; and
a radio frequency (RF) matching circuit between an RF port and a drain of the transistor, wherein an RF signal is input in the RF port, and wherein the RF matching circuit matches an impedance of the RF port and an impedance of the drain as viewed from the RF port;
wherein the LO matching circuit comprises:
a first transmission line having a first end connected to the source of the transistor;
a second transmission line having a first end connected to a second end of the first transmission line, wherein a second end of the second transmission line is connected to the LO port; and
a first capacitive element, wherein a first end of the first capacitive element is connected to a point of connection of the first transmission line and the second transmission line, wherein a second end of the first capacitive element is grounded.
2. The source injection mixer according to claim 1, wherein the first transmission line comprises a signal line and a plurality of second capacitive elements, wherein each of the plurality of second capacitive elements is between the signal line and ground.

3. The source injection mixer according to claim 1, wherein:
the IF matching circuit comprises:
an open stub having a first end connected to the gate of the transistor and a second end that is open;
a third transmission line having a first end connected to the gate of the transistor;
a fourth transmission line having a first end connected to a second end of the third transmission line;
a third capacitive element having a first end connected to a point of connection of the third transmission line and fourth transmission line, wherein a second end of the third capacitive element is grounded; and
a fourth capacitive element having a first end connected to a second end of the fourth transmission line, wherein a second end of the fourth capacitive element is connected to the IF port; and
the RF matching circuit comprises:
a fifth transmission line having a first end connected to the drain of the transistor;
a fifth capacitive element having a first end connected to a second end of the fifth transmission line, wherein a second end of the fifth capacitive element is grounded; and
a sixth capacitive element having a first end connected to the drain of the transistor, wherein a second end of the sixth capacitive element is connected to the RF port.

4. The source injection mixer according claim 1, further comprising:
a gate bias circuit that applies a gate bias voltage to the gate of the transistor; and
a drain bias circuit that applies a drain bias voltage to the drain of the transistor.

5. A source injection mixer, comprising:
a transistor;
an intermediate frequency (IF) matching circuit between an IF port and a gate of the transistor, wherein an IF signal is input in the IF port, and wherein the IF matching circuit matches an impedance of the IF port and an impedance of the gate as viewed from the IF port;
a shorting stub, wherein a first end of the shorting stub is directly connected to a source of the transistor, wherein a second end of the shorting stub is grounded, and wherein the shorting stub is shorter than a quarter of an electrical length at a frequency of a local oscillator (LO) signal;
an LO matching circuit between an LO port and the source of the transistor, wherein the LO signal is input in the LO port, and wherein the LO matching circuit matches an impedance of the LO port and an impedance of the source as viewed from the LO port; and
a radio frequency (RF) matching circuit between an RF port and a drain of the transistor, wherein an RF signal is input in the RF port, and wherein the RF matching circuit matches an impedance of the RF port and an impedance of the drain as viewed from the RF port;
wherein the LO matching circuit comprises:
a first transmission line having a first end connected to the source of the transistor;
a first capacitive element having a first end connected to a second end of the first transmission line; and
a second transmission line having a first end connected to a second end of the first capacitive element, wherein a second end of the second transmission line is connected to the LO port;
wherein the IF matching circuit comprises:
an open stub having a first end connected to the gate of the transistor, wherein a second end of the open stub is open;
a third transmission line having a first end connected to the gate of the transistor;
a fourth transmission line having a first end connected to a second end of the third transmission line;
a second capacitive element having a first end connected to a point of connection of the third transmission line and the fourth transmission line, wherein a second end of the second capacitive element is grounded; and
a third capacitive element having a first end connected to a second end of the fourth transmission line, wherein a second end of the third capacitive element is connected to the IF port; and
wherein the RF matching circuit comprises:
a fifth transmission line having a first end connected to the drain of the transistor;
a fourth capacitive element having a first end connected to a second end of the fifth transmission line, wherein a second end of the fourth capacitive element is grounded; and
a fifth capacitive element having a first end connected to the drain of the transistor, wherein a second end of the fifth capacitive element is connected to the RF port.

6. A mixer, comprising:
a transistor;
an first matching circuit between an first port and a gate of the transistor, wherein an first signal is input in the first port, and wherein the first matching circuit matches an impedance of the first port and an impedance of the gate as viewed from the first port;
a stub, wherein a first end of the stub is directly connected to a source of the transistor, wherein a second end of the stub is grounded, and wherein the stub is shorter than a quarter of an electric length at a frequency of a second signal;
an second matching circuit between an second port and the source of the transistor, wherein the second signal is input in the second port, and wherein the second matching circuit matches an impedance of the second port and an impedance of the source as viewed from the second port, wherein the second matching circuit comprises:
a first transmission line having a first end connected to the source of the transistor;
a second transmission line having a first end connected to a second end of the first transmission line, wherein a second end of the second transmission line is connected to the second port; and
a first capacitive element, wherein a first end of the first capacitive element is connected to a point of connection of the first transmission line and the second transmission line, wherein a second end of the first capacitive element is grounded; and
a third matching circuit between an third port and a drain of the transistor, wherein an third signal is input in the third port, and wherein the third matching circuit matches an impedance of the third port and an impedance of the drain as viewed from the third port.

7. The mixer according to claim 6, wherein the first signal is an intermediate frequency (IF) signal.

8. The mixer according to claim 6, wherein the second signal is a local oscillator (LO) signal.

9. The mixer according to claim 6, wherein the third signal is a radio frequency (RF) signal.

10. The mixer according to claim 6, wherein the first transmission line comprises a signal line and a plurality of second capacitive elements, wherein each of the plurality of second capacitive elements is between the signal line and ground.

11. The mixer according to claim 6, wherein:
the first matching circuit comprises:
   an open stub having a first end connected to the gate of the transistor and a second end that is open;
   a third transmission line having a first end connected to the gate of the transistor;
   a fourth transmission line having a first end connected to a second end of the third transmission line;
   a third capacitive element having a first end connected to a point of connection of the third transmission line and fourth transmission line, wherein a second end of the third capacitive element is grounded; and
   a fourth capacitive element having a first end connected to a second end of the fourth transmission line, wherein a second end of the fourth capacitive element is connected to the first port; and
the third matching circuit comprises:
   a fifth transmission line having a first end connected to the drain of the transistor;
   a fifth capacitive element having a first end connected to a second end of the fifth transmission line, wherein a second end of the fifth capacitive element is grounded; and
   a sixth capacitive element having a first end connected to the drain of the transistor, wherein a second end of the sixth capacitive element is connected to the third port.

12. The mixer according claim 6, further comprising:
a gate bias circuit that applies a gate bias voltage to the gate of the transistor; and
a drain bias circuit that applies a drain bias voltage to the drain of the transistor.

\* \* \* \* \*